(12) United States Patent
Burns et al.

(10) Patent No.: US 7,325,693 B2
(45) Date of Patent: Feb. 5, 2008

(54) WAFER CONTAINER AND DOOR WITH CAM LATCHING MECHANISM

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 451 days.

(21) Appl. No.: 10/988,993

(22) Filed: Nov. 15, 2004

(65) Prior Publication Data

US 2005/0127688 A1 Jun. 16, 2005

Related U.S. Application Data

(60) Provisional application No. 60/520,817, filed on Nov. 16, 2003.

(51) Int. Cl.
   *B65D 85/30* (2006.01)
(52) U.S. Cl. ...................................... 206/710; 220/326
(58) Field of Classification Search ........ 206/710–712, 206/723, 454, 832; 220/323, 324, 326; 292/DIG. 61, 292/40, 41, 32–37, 194, 195, 197, 215, 224, 292/234
   See application file for complete search history.

(56) References Cited

U.S. PATENT DOCUMENTS

| | | | |
|---|---|---|---|
| 2,818,195 A | 12/1957 | Scarlett | |
| 3,333,878 A * | 8/1967 | Pelcin | 292/37 |
| 4,995,430 A | 2/1991 | Bonora et al. | |
| 5,482,161 A | 1/1996 | Williams et al. | |
| 5,711,427 A | 1/1998 | Nyseth | |
| 5,915,562 A | 6/1999 | Nyseth et al. | |
| 5,931,512 A | 8/1999 | Fan et al. | |
| 5,957,292 A | 9/1999 | Mikkelsen et al. | |
| 6,000,732 A | 12/1999 | Scheler et al. | |
| 6,623,051 B2 * | 9/2003 | Bonora | 292/330 |
| 6,880,718 B2 * | 4/2005 | Eggum | 220/323 |
| 2003/0132232 A1 * | 7/2003 | Eggum | 220/323 |

* cited by examiner

*Primary Examiner*—Mickey Yu
*Assistant Examiner*—Jerrold Johnson
(74) *Attorney, Agent, or Firm*—Patterson, Thuente, Skaar & Christensen, P.A.

(57) ABSTRACT

A container for holding a single wafer includes a door with a latching mechanism having a cam with a pair of opposing wings extending laterally therefrom. The cam is selectively rotatably shiftable between a first favored position wherein the wings are completely within the door enclosure to enable the door to be engaged and disengaged from the door frame, and a second favored position wherein the wings extend laterally outward from the door enclosure so as to engage in the latch recesses in the door frame when the door is engaged in the door frame. The cam wings may include a ramped portion thereon for drawing the door into closer engagement in the door frame when the cam is rotated from the first favored position to the second favored position. Also, the latching mechanism may further include a spring disposed to provide a biasing force for urging the latching mechanism toward each of the first and second favored positions, and soft-stop dampening springs for decelerating the cam in a controlled fashion at the first and second favored positions and for absorbing vibrations resulting from the collision of the cam with a fixed stop on the door chassis.

22 Claims, 2 Drawing Sheets

WAFER CONTAINER AND DOOR WITH CAM LATCHING MECHANISM

RELATED APPLICATIONS

This application claims the benefit of U.S. Provisional Patent Application Ser. No. 60/520,817, filed Nov. 16, 2003, hereby fully incorporated herein by reference.

FIELD OF THE INVENTION

This application relates to sealable wafer containers, and more specifically to door latching mechanisms for wafer containers for holding a single wafer.

BACKGROUND OF THE INVENTION

Semiconductor wafers have become larger in scale, now with fabrication facilities commonly utilizing 300 mm wafers to be manufactured into semiconductor devices such as integrated circuits. The integrated circuits themselves have become larger in size with increasing circuit densities. As a consequence, the size of particulate contaminants that can destroy a circuit have decreased significantly, and strict particulate control is necessary during all phases of manufacturing, processing, transporting, and storage of semiconductor wafers.

Wafers are commonly stored and transported in sealed front-opening wafer containers that have a door secured by latches on the open front. The door can be typically removed manually or robotically. Such wafer containers are known in the industry as FOUPs, which is an acronym for front-opening unified pod, and FOSBs, an acronym for front-opening shipping box. The doors on these types of containers are operated with robotic interfaces that have precisely positioned keys that insert into the front of the door to operate latching mechanisms to remove and place the door with respect to the container portion.

Wafer container latching mechanisms ideally have certain characteristics. First, it is desirable that they operate reliably and consistently to latch and unlatch the door. Additionally, it is desirable that the latching mechanisms are made and designed so as to emit a minimum of particulates, such as may be generated by sliding contact of parts during operation. It is further desirable that the latch mechanisms are simple to manufacture, assemble, and clean. Moreover, it is desirable that these latching mechanisms operate smoothly with controlled changes in the relative velocities of moving parts. Many typical existing wafer container latching mechanisms exhibit relatively abrupt deceleration of components. For example, in some such mechanisms, moving parts collide with a fixed stop at the limits of travel. The result is impact and vibration that serves to "launch" any particulates that may be resting on surfaces in the container, thereby enabling such particulates to later precipitate onto the wafers causing contamination and damage.

Front opening wafer containers are typically designed to hold 25 wafers in an axially aligned generally parallel spaced apart arrangement. Recently, however, a need has emerged for sealable wafer containers for holding a single wafer. Prior attempts at latching mechanisms for single wafer containers have not been entirely satisfactory. These prior mechanisms may be prone to "launching" of particulates as described above. Also, some prior mechanisms are prone to accidental unlatching or dislodging of the door. Further, it is desirable that the latching mechanisms for these containers be operable with the same robotic equipment as for the larger containers.

What is needed in the industry is a wafer container for a single wafer having a latching mechanism with improved security, velocity control, and vibration characteristics.

SUMMARY OF THE INVENTION

The present invention meets the need of the industry for a wafer container for a single wafer with a door latching mechanism having improved security, velocity control, and vibration characteristics. According to an embodiment of the invention a container for holding a single wafer includes an enclosure portion having a top, a bottom, a pair of opposing sides, a back and an open front defined by a door frame with a pair of latch recesses defined therein. A wafer support is disposed in the enclosure for cushioningly receiving the wafer. Further, the container includes a door engagable in the door frame for sealingly closing the open front. The door has a chassis defining a door enclosure and at least one operable latching mechanism in the door enclosure. The latching mechanism includes a cam having a pair of opposing wings extending laterally therefrom, and is selectively rotatably shiftable between a first favored position wherein the wings are completely within the door enclosure to enable the door to be engaged and disengaged from the door frame, and a second favored position wherein the wings extend laterally outward from the door enclosure so as to engage in the latch recesses in the door frame when the door is engaged in the door frame.

The cam wings may include a ramped portion thereon for drawing the door into closer engagement in the door frame when the cam is rotated from the first favored position to the second favored position. Also, the latching mechanism may further include a spring disposed to provide a biasing force for urging the latching mechanism toward each of the first and second favored positions, and soft-stop dampening springs for decelerating the cam in a controlled fashion at the first and second favored positions and for absorbing vibrations resulting from the collision of the cam with a fixed stop on the door chassis. These soft-stop dampening springs may be integrally formed in one piece with the cam. The cam may also include a floating hub portion and an hour-glass or alternatively shaped key slot for reducing wear effects from slight misalignment of the robotic key with the key slot during operation.

A feature and advantage of the invention are the soft-stop dampening springs, which provide velocity control, positioning, and dampening characteristics to the latching mechanism.

An additional feature and advantage of the invention is the cam wing latching portions which eliminates the latching arms of prior wafer container latching mechanisms and enables use in a container door having a very short vertical dimension.

An additional feature and advantage of the invention is the single biasing spring which biases the cam toward each of first and second favored positions, thereby inhibiting unintended rotation and consequent accidental unlatching of the door from the enclosure.

An additional feature and advantage of the invention are the ramped portions on each of the cam wings which cause the door to be drawn into closer engagement in the door frame as the cam is rotated from the first favored position toward the second favored position, compressing a door seal is one is present and improving the seal of the door with the enclosure.

Another feature and advantage of the invention is the floating hub portion and wear reducingly shaped key-slot, which together minimize adverse wear effects from slight misalignment of a robotic key with the key slot during operation.

An advantage and feature of the invention is that the latching mechanism operates smoother and more quietly with less particulate launching due to the vibration dampening features.

DETAILED DESCRIPTION OF THE PREFERRED EMBODIMENTS

Figure 1:
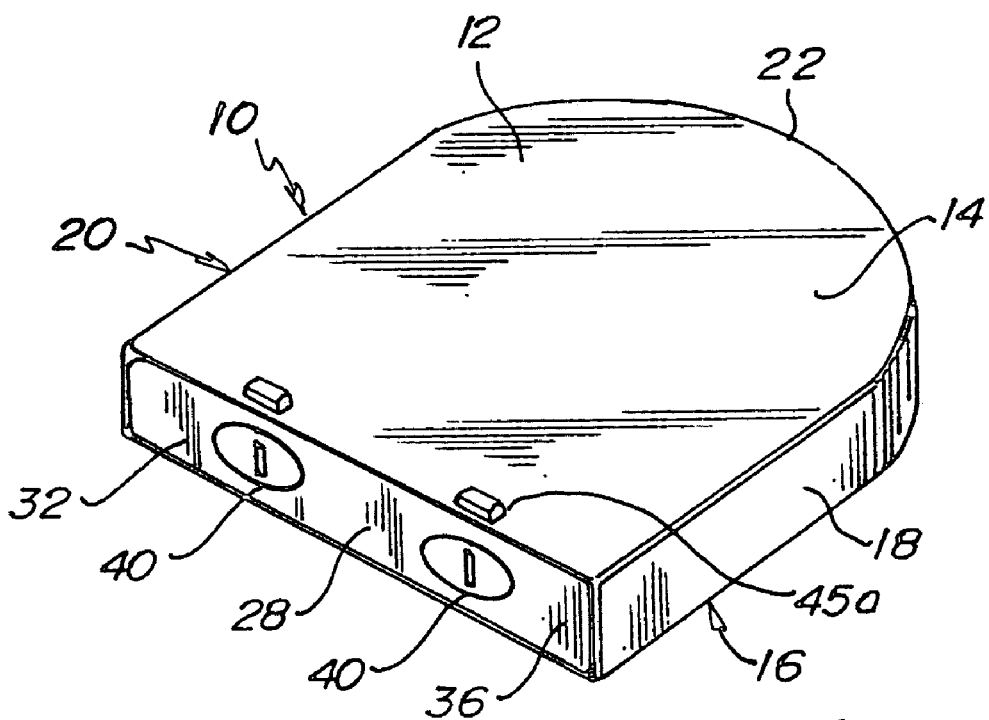
FIG. 1 is a perspective view of a front-opening wafer container for holding a single wafer.
Figure 2:
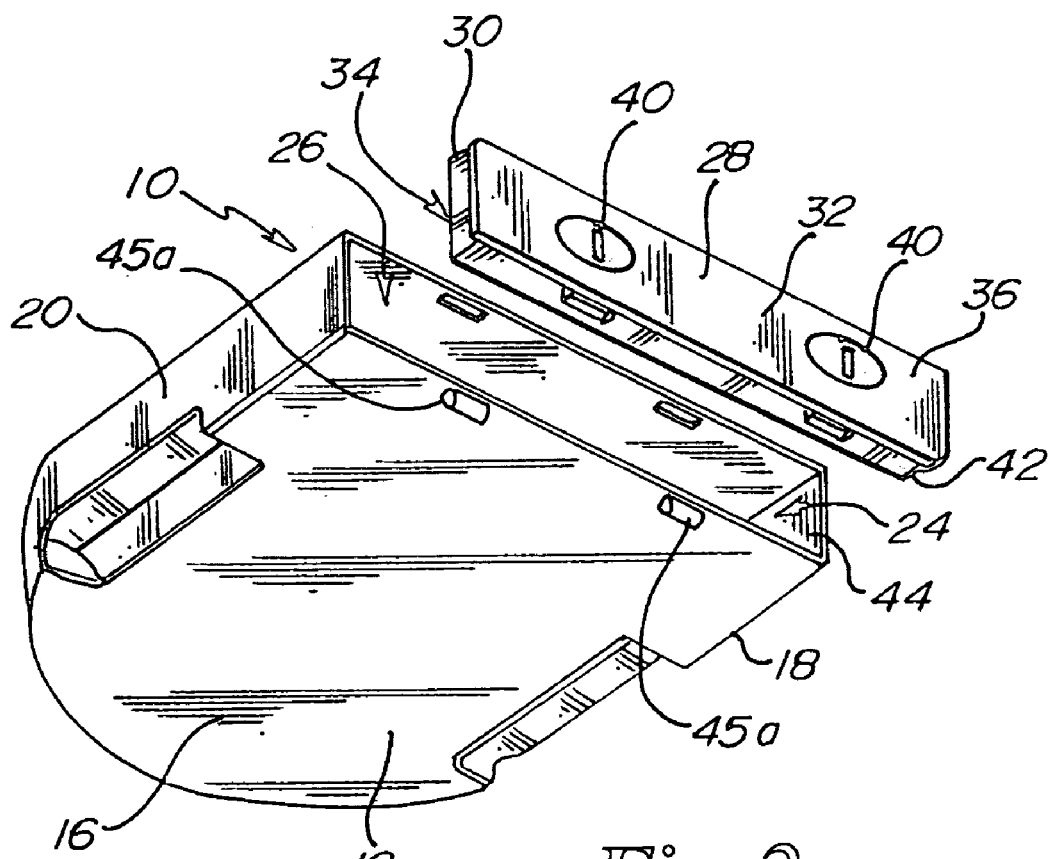
FIG. 2 is a perspective view of an alternative embodiment of a front-opening wafer container for holding a single wafer.

Referring to FIGS. 1 and 2, a front opening wafer container 10 for holding a single wafer according to embodiments of the invention generally includes an enclosure portion 12, having a top 14, a bottom 16, a pair of opposing sides 18, 20, a back 22 and an open front 24, enclosing an open interior 26. Wafer container 10 further generally includes door 28 for sealingly closing open front 24. Door 28 generally includes chassis 30 having a front or exterior side 32, and a back or interior side 34. Front side 32 includes panel 36 covering one or more latching mechanisms 38, which are operated through keyholes 40 defined in panel 36. Sealing means (not depicted) may be provided at periphery 42 of door 28 to sealingly engage with door frame 44 in enclosure portion 12. Latching recesses 45 are provided in door frame 44. If desired in order to minimize the thickness of material needed at door frame 44, exterior housings 45a may be used to define latch recesses 45.

Figure 3:
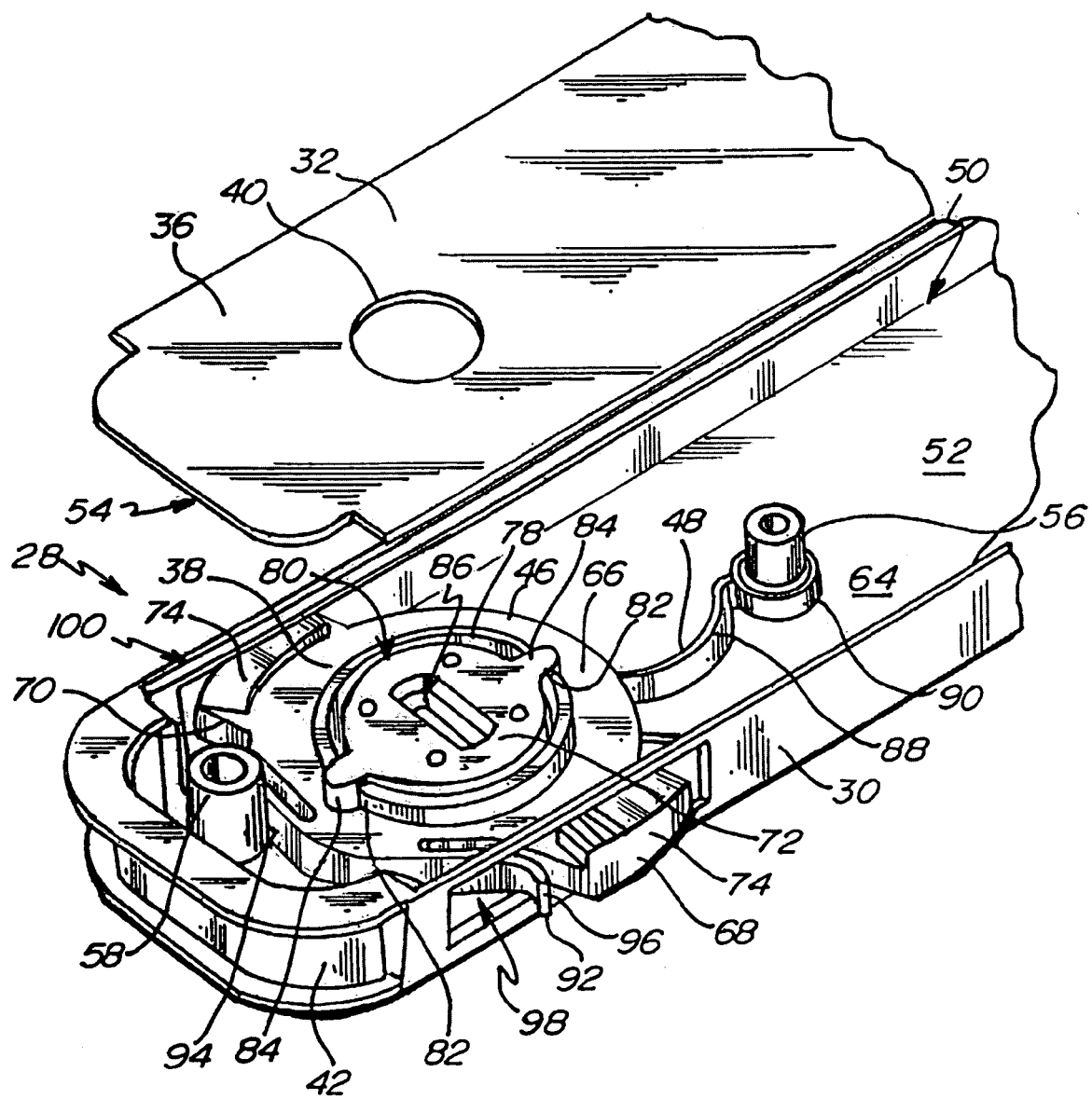
FIG. 3 is a partial perspective view of a door of a single wafer container according to the invention with the cover removed to expose the door latching mechanism.

Referring now to FIG. 3, door 28 is depicted without panel 36 so as to expose one of latching mechanisms 38. Each latching mechanism 38 according to an embodiment of the invention generally includes a rotatable cam 46 and biasing spring 48. Latching mechanisms 38 are generally positioned in door enclosure 50, which is defined by inner surface 52 of chassis 30 and inner surface 54 of panel 36. Posts 56, 58, extend outwardly from inner surface 64 into door enclosure 50. An additional post (not depicted) likewise extends from inner surface 64 into door enclosure 50 upon which cam 46 is rotatable mounted.

Cam 46 generally includes a body portion 66 having a pair of opposing cam wings 68, 70, and floating hub portion 72. Each cam wing 68, 70, includes ramped portion 74 on outwardly facing side 76. Wall 78 defines recess 80 in the outwardly facing side of cam 46, and has opposing notches 82 defined therein. Floating hub portion 72 is received in recess 80 with tabs 84 engaged in notches 82 so that floating hub portion is rotationally "locked" in body portion 66 while being enabled to float laterally to a limited degree. Key slot 86 is provided in floating hub portion 72 for receiving a key (not depicted) to actuate the latches. Key slot 86 may have an "hourglass" or other shape for improving wear characteristics as disclosed in U.S. Pat. No. 6,712,213, commonly owned by the owner of the present application, and hereby fully incorporated herein by reference.

Biasing spring 48 is generally c-shaped as depicted and generally includes a main portion 88 connecting a pair of bushings 90. One of bushings 90 is rotatably received on post 56 and the other is rotatably received on a post (not depicted) which extends from the underside of cam 46. In operation, biasing spring 48 functions to bias cam 48, toward first and second favored positions corresponding to latched and unlatched conditions, as generally described in more detail hereinbelow and in copending U.S. patent application Ser. No. 10/318,374 entitled WAFER CARRIER DOOR AND SPRING BIASED LATCHING MECHANISM, commonly owned by the owners of the present invention and hereby fully incorporated herein by reference.

In the embodiment of FIG. 3 a pair of soft-stop dampening springs 92, 94, extend in opposite directions along the circumference of body portion 66. Each dampening spring 92, 94, has a tangentially curved end 96 conforming shaped with post 58 and positioned so as to be contactingly received thereon when cam 46 is in the first and second favored positions respectively. Springs 92, 94, are preferably integrally molded in one piece with body portion 66, but may also be separate structures.

In operation, when door 28 is disengaged from enclosure portion 12, cam 46 is positioned in the first favored position with dampening spring 92 contacting post 58. In this position, spring 48 rotationally biases cam 46 clockwise, and cam wings 68, 70, are entirely within door enclosure 50. Door 28 may then be engaged in door frame 44, and cam 46 rotated counterclockwise so that cam wings 68, 70, extend outward through apertures 98, 100, in chassis 30 and into latch recesses 45 in door frame 44. As cam wings 68, 70, rotate into latch recesses 45, ramped portions 74 contact and slide on the inner surface of latch recesses 45, pulling door 28 into increasingly tight engagement with enclosure portion 12 and compressing the door seal if one is provided. At the midpoint of rotational travel of cam 46, spring 48 is compressed to the maximum extent, and as the midpoint is passed, spring 48 biases cam 46 in the opposite rotational direction. When the second favored position is reached as depicted in FIG. 3, spring 94 contacts post 58. The resilience of spring 94 decelerates cam 46 to a stop in a controlled fashion and absorbs vibrations resulting from the collision of spring 94 with post 58. Further, the engagement of tangentially curved end 96 of spring 94 around post 58 acts as a stop preventing further counterclockwise rotation of cam 46. In this position, spring 48 rotationally biases cam 46 counterclockwise, inhibiting any tendancy for clockwise rotation of cam 46, which might lead to unintended unlatching and disengagement of door 28 from enclosure portion 12.

When in the second favored position depicted in FIG. 3, latching mechanism 38 may be disengaged by rotating cam 46 in a clockwise direction against the bias of spring 48. When the first favored position is reached, spring 92 contacts post 58. The resilience of spring 92 decelerates cam 46 to a stop in a controlled fashion and absorbs vibrations resulting from the collision of spring 92 with post 58. Further, the engagement of tangentially curved end 96 of spring 92 around post 58 acts as a stop preventing further clockwise rotation of cam 46.

Various components identified herein may be molded from suitable thermoplastic or other material having characteristics suitable for use in wafer containers. Desirable thermoplastics would include polyetheretherketone (PEEK) with carbon fiber filler or carbon powder filler, polyetherimide (PEI), polycarbonate or other suitable thermoplastics as are generally known in the art.

What is claimed is:

1. A container for holding a single wafer comprising:
    an enclosure portion having a top, a bottom, a pair of opposing sides, a back and an open front defined by a door frame, the door frame having a pair of latch recesses defined therein;
    a wafer support in the enclosure; and
    a door engagable in the door frame for sealingly closing the open front, the door comprising:
        a chassis defining a door enclosure; and
        at least one operable latching mechanism in the door enclosure, the latching mechanism including a selectively rotatable cam having a pair of laterally projecting opposing wings, the wings being fixedly coupled to the cam so as to rotate with the cam, the cam rotatably shiftable between a first favored position wherein the wings are completely within the door enclosure to enable the door to be engaged and disengaged from the door frame, and a second favored position wherein the wings extend laterally outward from the door enclosure so as to engage in the latch recesses in the door frame when the door is engaged in the door frame, the latching mechanism further including a spring disposed to provide a biasing force for urging the latching mechanism toward each of the first and second favored positions.

2. The container of claim 1, wherein the latching mechanism further includes a pair of soft-stop dampening springs for decelerating the cam at the first and second favored positions.

3. The container of claim 2, wherein the soft-stop dampening springs extend in opposite directions along the circumference of the cam.

4. The container of claim 3, wherein each soft-stop dampening spring has a tangentially curved end.

5. The container of claim 2, wherein the soft-stop dampening springs are integrally formed together with the cam in one piece.

6. The container of claim 1, wherein the cam comprises a body portion defining a recess and a hub portion floatingly received in the recess.

7. The container of claim 1, wherein the cam includes an hour-glass shaped key slot for receiving a robotic actuating key.

8. The container of claim 1, wherein each wing includes a ramped portion for engaging the latch recesses, the ramped portion disposed so that the door is drawn into tighter engagement in the door frame as the cam is rotated from the first favored position toward the second favored position.

9. A container for holding a single wafer comprising:
an enclosure portion having a top, a bottom, a pair of opposing sides, a back and an open front defined by a door frame, the door frame having a pair of latch recesses defined therein;
a wafer support in the enclosure; and
a door engagable in the door frame for sealingly closing the open front, the door comprising:
a chassis defining a door enclosure; and
at least one operable latching mechanism in the door enclosure, the latching mechanism including a selectively rotatable cam having a pair of laterally projecting opposing wings, the wings being fixedly coupled to the cam so as to rotate with the cam, the cam rotatably shiftable between a first favored position wherein the wings are completely within the door enclosure to enable the door to be engaged and disengaged from the door frame, and a second favored position wherein the wings extend laterally outward from the door enclosure so as to engage in the latch recesses in the door frame when the door is engaged in the door frame, the latching mechanism further including biasing means for urging the latching mechanism toward each of the first and second favored positions.

10. The container of claim 9, wherein the latching mechanism further includes means for decelerating the cam at the first and second favored positions.

11. The container of claim 10, wherein in the means for decelerating the cam at the first and second favored positions comprises a pair of soft-stop dampening springs on the cam.

12. The container of claim 11, wherein the soft-stop dampening springs extend in opposite directions along the circumference of the cam.

13. The container of claim 12, wherein each soft-stop dampening spring has a tangentially curved end.

14. The container of claim 12, wherein the soft-stop dampening springs are integrally formed together with the cam in one piece.

15. The container of claim 10, wherein each wing includes a ramped portion for engaging the latch recesses, the ramped portion disposed so that the door is drawn into tighter engagement in the door frame as the cam is rotated from the first favored position toward the second favored position.

16. The combination of claim 10, wherein the means for drawing the door into closer engagement in the door frame when the cam is rotated from the first to the second favored position comprises a ramped portion on each cam wing.

17. The combination of a wafer and a container for holding the wafer, the container comprising:
an enclosure portion having a top, a bottom, a pair of opposing sides, a back and an open front defined by a door frame, the door frame having a pair of latch recesses defined therein;
a wafer support in the enclosure for cushioningly receiving the wafer; and
a door engagable in the door frame for sealingly closing the open front, the door comprising:
a chassis defining a door enclosure; and
at least one operable latching mechanism in the door enclosure, the latching mechanism including a selectively rotatable cam having a pair of laterally projecting opposing wings, the wings being fixedly coupled to the cam so as to rotate with the cam, the cam rotatably shiftable between a first favored position wherein the wings are completely within the door enclosure to enable the door to be engaged and disengaged from the door frame, and a second favored position wherein the wings extend laterally outward from the door enclosure so as to engage in the latch recesses in the door frame when the door is engaged in the door frame, the latching mechanism further including biasing means for urging the latching mechanism toward each of the first and second favored positions and means for drawing the door into closer engagement in the door frame when the cam is rotated from the first to the second favored position.

18. The combination of claim 17, wherein the latching mechanism further includes means for decelerating the cam at the first and second favored positions.

19. The combination of claim 18, wherein in the means for decelerating the cam at the first and second favored positions comprises a pair of soft-stop dampening springs on the cam.

20. The combination of claim 19, wherein the soft-stop dampening springs extend in opposite directions along the circumference of the cam.

21. The combination of claim 20, wherein each soft-stop dampening spring has a tangentially curved end.

22. The combination of claim 19, wherein the soft-stop dampening springs are integrally formed together with the cam in one piece.

* * * * *